United States Patent
Bains

(10) Patent No.: US 7,336,551 B2
(45) Date of Patent: Feb. 26, 2008

(54) SEMICONDUCTOR MEMORY DEVICES AND SYSTEMS, AND METHODS OF USING HAVING REDUCED TIMERS AND REGISTERS

(75) Inventor: Kuljit S. Bains, Olympia, WA (US)

(73) Assignee: Intel Corporation, Santa Ana, CA (US)

( * ) Notice: Subject to any disclaimer, the term of this patent is extended or adjusted under 35 U.S.C. 154(b) by 1 day.

(21) Appl. No.: 11/291,285

(22) Filed: Nov. 30, 2005

(65) Prior Publication Data

US 2007/0121399 A1    May 31, 2007

(51) Int. Cl.
*G11C 7/00* (2006.01)
(52) U.S. Cl. .................... 365/203; 365/194
(58) Field of Classification Search ............ 365/230, 365/230.02, 230.05, 230.09, 231, 185.25, 365/203, 230.8, 194; 708/704; 710/6; 711/106, 711/167
See application file for complete search history.

(56) References Cited

U.S. PATENT DOCUMENTS

| | | | | |
|---|---|---|---|---|
| 5,636,173 | A * | 6/1997 | Schaefer | 365/230.03 |
| 6,571,325 | B1 * | 5/2003 | Satagopan et al. | 711/169 |
| 6,591,323 | B2 * | 7/2003 | Yu | 710/244 |
| 6,687,172 | B2 * | 2/2004 | Wilcox | 365/201 |
| 6,721,864 | B2 * | 4/2004 | Keskar et al. | 711/167 |
| 7,151,713 | B2 * | 12/2006 | Nakazawa | 365/230.08 |
| 2004/0059840 | A1 * | 3/2004 | Perego et al. | 710/6 |
| 2007/0121398 | A1 * | 5/2007 | Bellows et al. | 365/203 |

* cited by examiner

*Primary Examiner*—Van Thu Nguyen
*Assistant Examiner*—Han Yang
(74) *Attorney, Agent, or Firm*—Marger Johnson & McCollom, P.C.

(57) ABSTRACT

A device including a command decoder to receive a compound command, a timer to begin operating if the compound command includes an activate command and a precharge command, the timer to begin operating at substantially the same time as the activate command is issued, and control logic coupled to the command decoder to precharge bit lines no earlier than when the timer reaches a target time period.

17 Claims, 3 Drawing Sheets

SEMICONDUCTOR MEMORY DEVICES AND SYSTEMS, AND METHODS OF USING HAVING REDUCED TIMERS AND REGISTERS

BACKGROUND

Semiconductor memory devices may be implemented in a variety of ways. One such implementation is a dynamic random access memory (DRAM). DRAMs may be controlled by a memory controller. The memory controller may regulate access to the DRAMs through commands sent to the DRAMs. For example, the memory controller may issue an activate command to activate a row of a memory array. After a delay of a particular time period, the memory controller may issue a read command to access a column of the activated row. This delay is called the row address to column address delay, or tRCD.

The memory controller may issue such a read command with a precharge command. Although the commands may be issued simultaneously, there must be a delay between the issuance of the read command to the issuance of the precharge command. This delay is called the read to precharge delay, or tRTP. After a column access strobe (CAS) latency delay, or tCL, and a posting time delay, read data becomes available to be read outside the DRAM. Similar time periods and delays apply when a write command is issued.

Another time period, the row access strobe, or tRAS, designates the minimum time after an activate command that a precharge command may be issued. In general, the precharge command is issued after both the posting of the data described above and after the time tRAS after the activate command.

To ensure that the DRAM does not precharge too early, the DRAM has timers to time tRCD, tRTP, the posting time, and tRAS. The DRAM must compare the sum of tRCD, tRCP, and the posting time to tRAS to make sure that the tRAS restriction is not violated if the sum is less than tRAS.

Thus, a DRAM generally has at least two timers and logic to perform a comparison on the values stored in the timers before issuing a precharge command.

DETAILED DESCRIPTION

Figure 1:
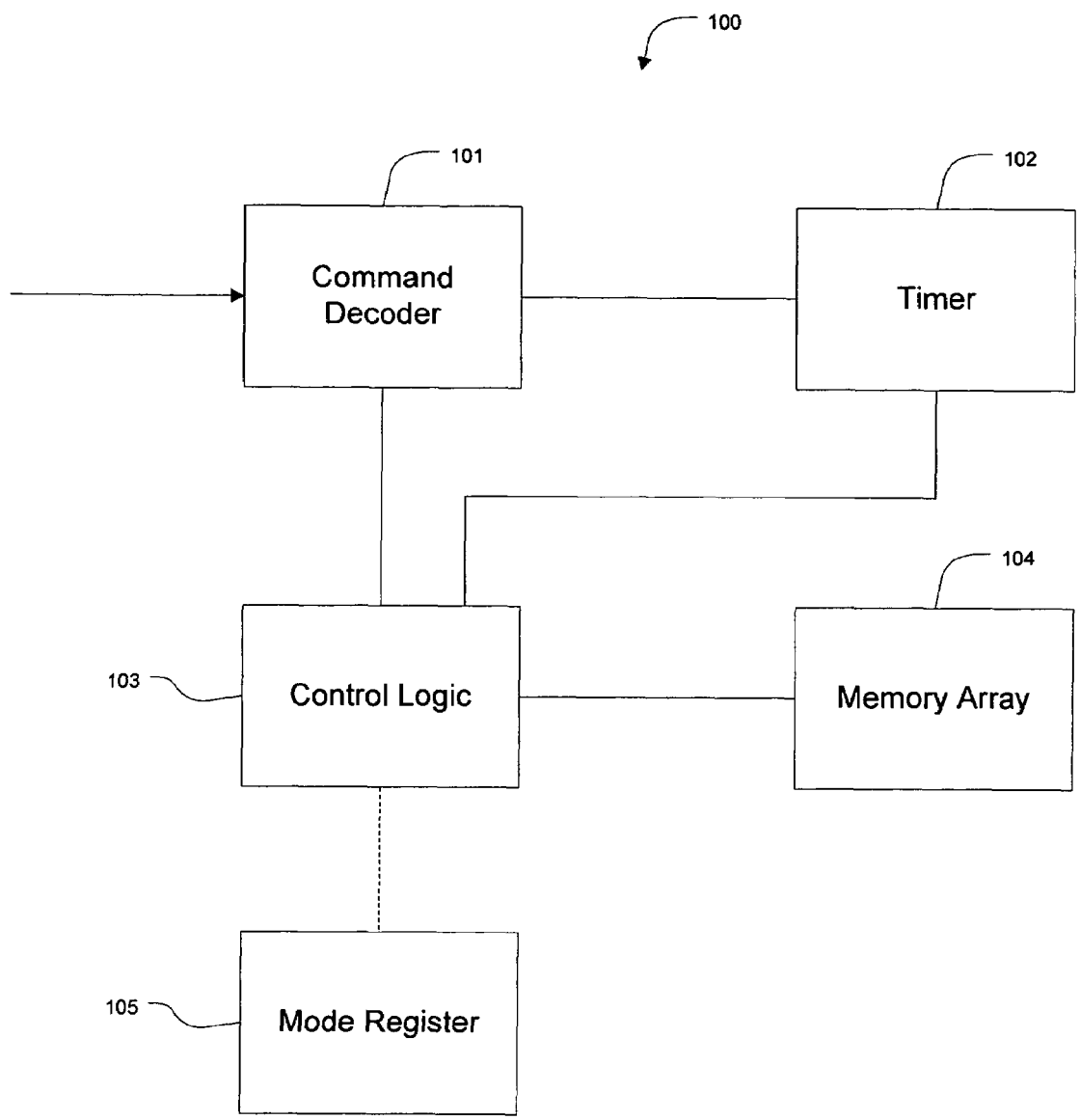
FIG. 1 shows a block diagram of a semiconductor memory device with reduced timers and registers.

FIG. 1 shows a block diagram of a semiconductor memory device 100 with reduced timers and registers. A semiconductor memory device 100 includes a command decoder 101, a timer 102, control logic 103, and a memory array 104. The command decoder 101 receives commands that control the semiconductor memory device 100. These commands may include activate, read, write, precharge, auto precharge, and other commands for controlling the semiconductor memory device 100.

Such individual commands may be combined into a compound command. A compound command is a set of commands that is sent in one transmission to the command decoder 101. For example, a compound command may include an activate command, a read command, and an auto-precharge command. In addition, a compound command may include an activate command, a write command, and an auto-precharge command. The compound command may also include a read command and an auto-precharge command, without an activate command. Without receiving other commands or compound commands, the semiconductor memory device 100 may issue the commands of a compound command at the appropriate time.

In one example, at some time after a compound command including at least an activate command and a precharge command is received, the command decoder 101 issues the activate command. At approximately the same time, the timer 102 begins timing. When the timer 102 reaches a target time period, the precharge command is issued. The precharge command causes the control logic 103 to precharge bit lines of the memory array 104.

Although a timer 102 increasing in time has been described, a person of ordinary skill in the art will understand that the timer 102 may be implemented in other ways. For example, the timer 102 may be loaded with the target time period and decrease in time.

A semiconductor memory device 100 may include a mode register 105. The mode register 105 may store a value representing the target time period to be compared with the timer 102. One of ordinary skill in the art will understand that the value need not be the exact number of the target time period. For example, the value may be an encoded version of the target time period. Alternatively, the target time period may be included in a compound command. For example, a portion of a compound command may be an encoded version of the target time period.

As stated above, the timer 102 may operate in response to a compound command including at least an activate command and a precharge command. In another example, the timer 102 may not operate if the compound command does not include both an activate command and a precharge command. Consider a compound command containing an activate command, a read command, but no precharge command. When such a compound command is issued, a page of memory is opened with the activate command, but is not closed with a precharge command. Subsequent compound commands including read commands and write commands may be issued before a compound command including a precharge command closes the page of memory is issued. In this case, the semiconductor memory device 100 does not operate the timer 102 to keep track of the target time period. Although the target time period may be set to any time, preferably, the target time period is set to a time that is greater than or equal to the minimum required time between an activate and a precharge, or tRAS. The semiconductor memory device 100 may rely on a memory controller such as a memory controller 301 (described below with reference to FIG. 3) to ensure that tRAS is not violated when a compound command does not include both a activate command and a precharge command. As a result, the latency and throughput of the semiconductor memory device 100 is optimized while not violating any design parameters.

As described above, time periods, such as the sum of tRTP, tRCD, and a posting time, may be compared with tRAS before issuing a precharge command. This comparison requires additional logic and timers. By using a timer 102 for tracking tRAS and issuing a precharge command after the timer 102 reaches a target time period, there is no need to compare the timer 102 with any other time period. Thus, the need for the additional circuitry, timers, and registers is eliminated.

Figure 2:
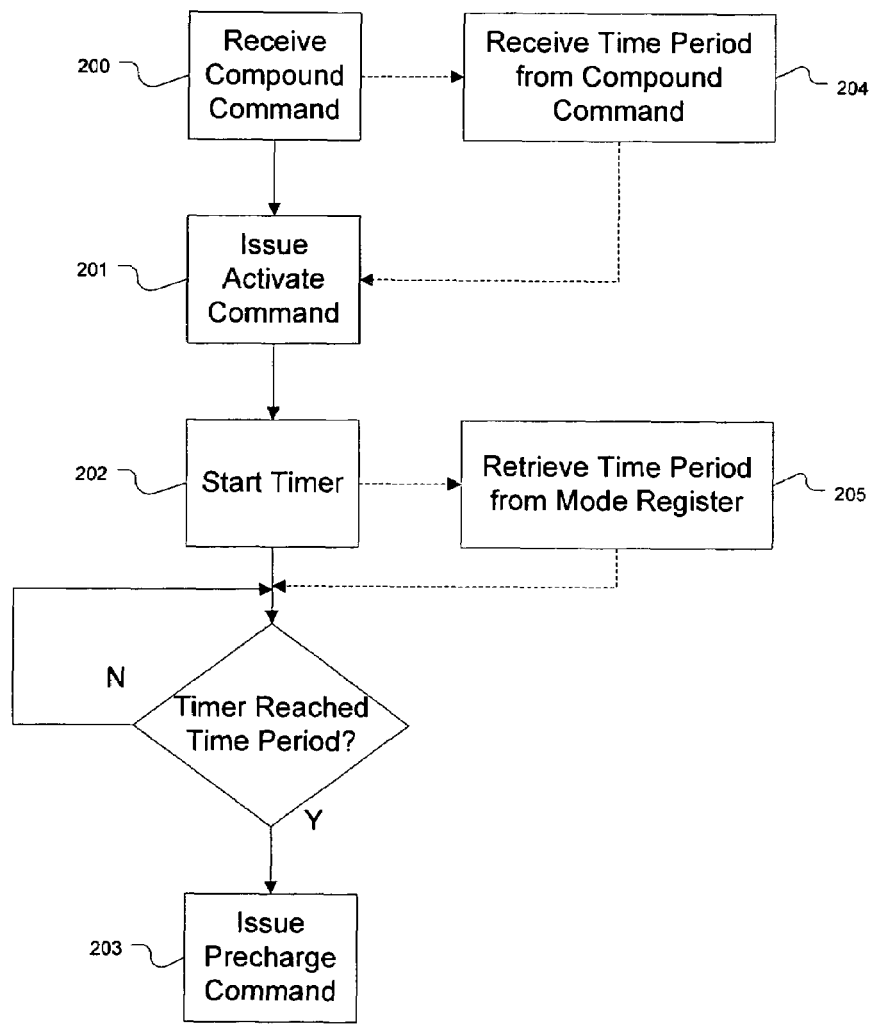
FIG. 2 shows a flowchart describing an embodiment of a method of operating a semiconductor memory device with reduced timers and registers.

FIG. 2 shows a flowchart describing an embodiment of a method of operating a semiconductor memory device with reduced timers and registers. A compound command is received in 200. In one example, the compound command includes at least an activate command and a precharge command. The activate command is issued in 201. A timer is started in 202 at substantially the same time that the page of memory is activated. After the timer reaches a target time period, the precharge command is issued in 203.

As mentioned above, the target time period may be stored in a mode register. To determine if the timer has reached the target time period, the timer may be compared with the target time period stored in the mode register. The timer period may optionally be retrieved from the mode register in 205. If the timer is substantially greater than or equal to the time in the mode register, the precharge command may be issued.

Alternatively, the target time period may be encoded in the compound command as described above. When the compound command is received in 200, the target time period may be received from the compound command in 204. This received target time period is then loaded into the timer or compared with the timer to determine if the precharge command should be issued.

In another embodiment of a method, if the received compound command does not contain both an activate and a precharge command, the timer is not started. Thus, the semiconductor memory device 100 does not keep track of tRAS unless the compound command contains both an activate and a precharge command.

As mentioned above, the target time period may be greater than or equal to a minimum time period between the issuance of an activate command and a precharge command. Thus, if the target time period is set to the minimum time period, the latency and throughput of the semiconductor memory device may be optimized.

Figure 3:
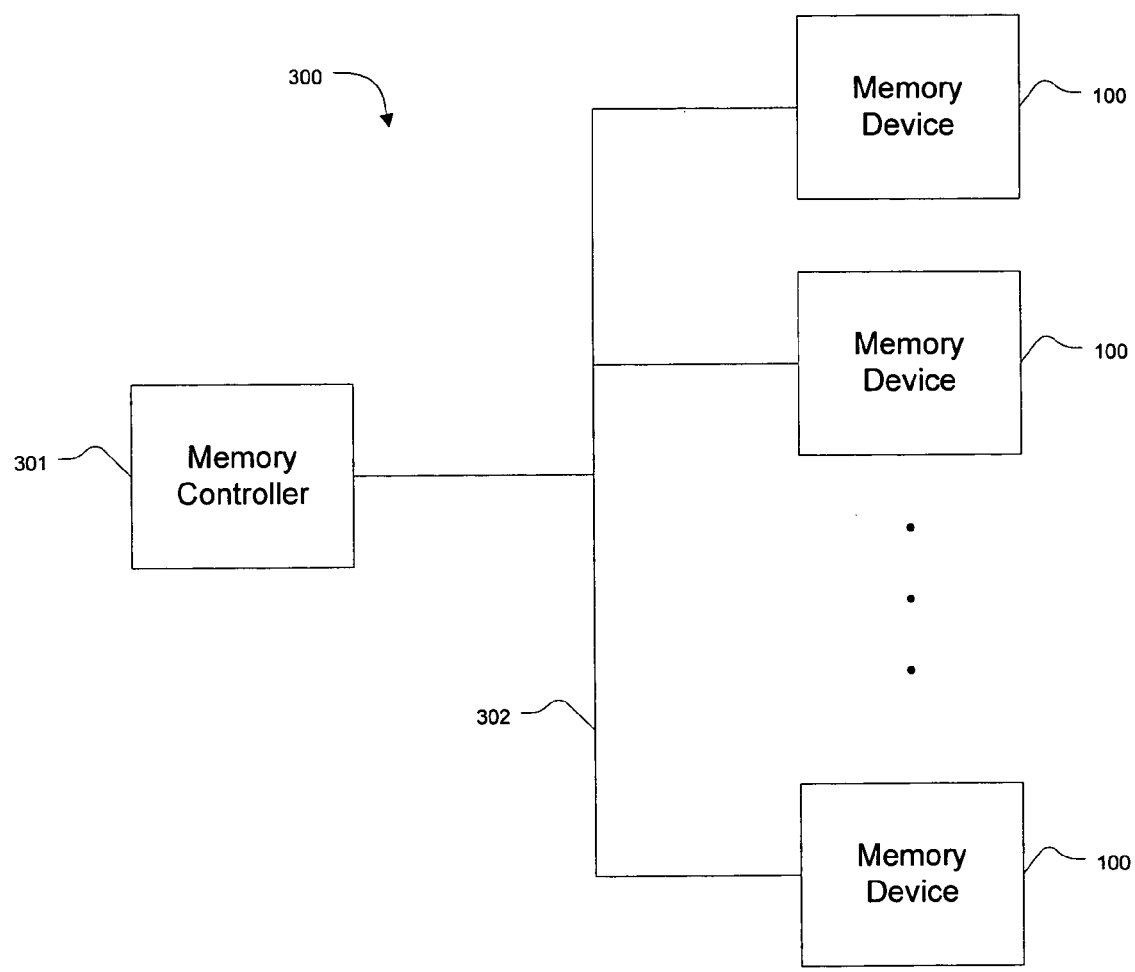
FIG. 3 illustrates an embodiment of a semiconductor memory system including semiconductor devices with reduced timers and registers.

FIG. 3 illustrates a semiconductor memory system 300 including semiconductor memory devices 100 with reduced timers and registers. The semiconductor memory system 300 includes a memory controller 301, address, data, and control lines 302, and semiconductor memory devices 100. The semiconductor memory devices 100 may be configured and operate as described above.

The memory controller 301 sends compound commands to the semiconductor memory devices 100. As described above, the compound commands may include an activate command and a precharge command. The memory controller 301 may encode in the compound command the target time period to be used by the semiconductor memory devices 100.

The memory controller 301 may configure the semiconductor memory devices 100. Part of this configuration may include setting the mode register 105. The target time period used in the semiconductor memory device 100 to control the precharge may be set in the mode register 105. Thus, the memory controller 301 may set the target time period in a mode register 105 of a semiconductor memory device 100.

Regardless of how the target time period used for a semiconductor memory device 100 is communicated to the semiconductor memory device 100, the memory controller 301 may store target time periods for each semiconductor memory device 100, including multiple target time periods for one semiconductor memory device 100. For example, one semiconductor memory device 100 may have multiple banks of memory arrays 104, each of which has an associated target time period.

The memory controller 301 controls the accesses to the semiconductor memory devices 100. The memory controller 301 may have several reads or writes that it must process. To expedite the reads and writes, the memory controller 301 may delay a precharge command beyond the required minimum time so that a semiconductor memory device 100 may process the reads or writes before the precharge. The memory controller 301 may encode such a longer target time period in the compound command sent to the semiconductor memory device 100. Alternatively, the memory controller 301 may not send an activate command with a precharge command. The memory controller 301 may send the precharge command in a compound command after the compound command containing the activate command to delay the precharge command. For example, the memory controller first sends a compound command including an activate command and a read command. Subsequently, the memory controller may send a compound command including a write command and a precharge command. By sending the compound command including the precharge command at a later time, the memory controller has controlled the delay between an activate command and a precharge command in the semiconductor memory device 100. In this situation, the semiconductor memory device 100 will not operate to keep track of a target time period before issuing a precharge command.

Although the target time period in a semiconductor memory device 100 associated with an activate command and a precharge command has been described as being stored in a mode register 105 or sent in a compound command, the target time period may be hard coded in the semiconductor memory device 100. Furthermore, a semiconductor memory device 100 is not limited to using only one way of obtaining a target time period. For example, in one compound command, the target time period may be encoded in the compound command and in a later compound command, the target time period may be a time period hard coded in the semiconductor memory device 100.

Although a command labeled a precharge command has been described, a precharge command may include any command that would cause a semiconductor memory device 100 to precharge any portion of the semiconductor memory device 100. For example, such a precharge command may be an auto-precharge command.

Although compound commands have been described as including some commands, such as an activate command, and excluding other commands, such as a precharge command, and have alternatively been described as including both an activate command and a precharge command, one of ordinary skill in the art will understand that other commands may be included in such compound commands. Such other commands may include, for example, read commands, write commands, or other commands used in the operation of a semiconductor memory device.

The semiconductor memory device described above may be utilized in any system that may utilize a DRAM memory. For example, such DRAM memories may include asynchronous DRAM, synchronous DRAM (SDRAM), double data rate DRAM (DRR SDRAM), extended data out DRAM (EDO DRAM), Rambus DRAM (RDRAM), etc. Such systems may include desktop computers, servers, multiprocessor clusters, etc.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

The invention claimed is:

1. A device comprising:
   a command decoder to receive a compound command;
   a timer to begin operating if the compound command includes at least an activate command and a precharge command, the timer to begin operating at substantially the same time as the activate command is issued; and
   control logic coupled to the command decoder to precharge a plurality of bit lines no earlier than when the timer reaches a target time period;
   wherein the target time period is encoded in the compound command and the target time period to be stored in a mode register.

2. The device of claim 1, the timer further to begin operating only if the compound command contains both the activate command and the precharge command.

3. The device of claim 1, the target time period further comprising a minimum time period between an issuance of the activate command and an issuance of the precharge command.

4. The device of claim 1, the control logic further to precharge the plurality of bit lines without comparing the timer to a value other than the target time period and regardless of any other timers associated with the precharge command.

5. A method comprising:
   receiving a compound command including at least an activate command and a precharge command;
   issuing the activate command;
   starting a timer at a substantially same time as issuing the activate command; issuing the precharge command after the timer reaches a target time period regardless of; and issuing the precharge command including:
   retrieving the target time period from a mode register; and comparing the timer to the target time period.

6. The method of claim 5, receiving the compound command further comprising receiving the target time period from the compound command.

7. The method of claim 5, further comprising starting the timer only if the compound command includes both the activate command and the precharge command.

8. The method of claim 5, the target time period further comprising a minimum time period between an issuance of the activate command and an issuance of the precharge command.

9. The method of claim 5, issuing the precharge command further comprising issuing the precharge command without comparing the timer to a value other than the target time period.

10. A system comprising:
    a plurality of semiconductor memory devices each semiconductor memory device including:
    a command decoder to receive a compound command;
    a timer to begin operating if the compound command includes at least an activate command and a precharge command, the timer to begin operating at substantially the same time as the activate command is issued; and
    control logic coupled to the command decoder to precharge a plurality of bit lines no earlier than when the timer reaches a target time period; and
    a memory controller coupled to the semiconductor memory devices, the memory controller to send the compound command to at least one of the semiconductor memory devices; and to set the target time period in a mode register of one of the semiconductor memory devices.

11. The system of claim 10, the memory controller further to send the target time period in the compound command.

12. The system of claim 10, the memory controller further to set the target time period of one of the semiconductor memory devices to be greater than a minimum required time period and to process a plurality of read or write commands between issuing the activate command and issuing the precharge command.

13. The system of claim 10, the timer of each of the plurality of semiconductor memory devices to begin operating only if the compound command contains both the activate command and the precharge command.

14. The system of claim 10, the target time period further comprising a minimum time period between an issuance of the activate command and an issuance of the precharge command.

15. The system of claim 10, the control logic of each of the plurality of semiconductor memory devices further to precharge the plurality of bit lines without comparing the timer to a value other than the target time period and regardless of any other timers associated with the precharge command.

16. The system of claim 10, the memory controller further to store a plurality of target time periods, each of the plurality of semiconductor memory devices associated with at least one of the target time periods.

17. The system of claim 16, each of the plurality of semiconductor memory devices further comprising a plurality of memory banks, each memory bank associated with one of the target time periods.

* * * * *

UNITED STATES PATENT AND TRADEMARK OFFICE
CERTIFICATE OF CORRECTION

PATENT NO.       : 7,336,551 B2                                              Page 1 of 1
APPLICATION NO.  : 11/291285
DATED            : February 26, 2008
INVENTOR(S)      : Kuljit S. Bains It is certified that error appears in the above-identified patent and that said Letters Patent is hereby corrected as shown below:

Column 5, line 39, the word "of;" should read -- of any other timers associated with the precharge command; --.

Signed and Sealed this

Twenty-fourth Day of March, 2009

JOHN DOLL
*Acting Director of the United States Patent and Trademark Office*